United States Patent [19]

Peterson et al.

[11] 4,387,283
[45] Jun. 7, 1983

[54] APPARATUS AND METHOD OF FORMING ALUMINUM BALLS FOR BALL BONDING

[75] Inventors: James R. Peterson, Garland; Edward M. Majors, Plano, both of Tex.

[73] Assignee: Texas Instruments Incorporated, Dallas, Tex.

[21] Appl. No.: 289,659

[22] Filed: Aug. 3, 1981

[51] Int. Cl.³ .............................................. B23K 31/00
[52] U.S. Cl. ................................. 219/56.21; 29/839; 219/56.22; 228/4.5; 228/173 E
[58] Field of Search ...................... 219/56, 56.1, 56.21, 219/56.22; 228/4.5, 123, 173 E, 141.1, 164; 29/838, 839

[56] References Cited
U.S. PATENT DOCUMENTS 3,641,660  2/1972  Adams et al. ......................... 228/4.5
4,098,447  7/1978  Edson et al. ......................... 228/4.5

OTHER PUBLICATIONS

Landes, "Self Starting Current Control Discharge Bonding Wire Ball Maker", U.S. Patent Application Ser. No. 250,623, 3/30/81.
Van Luvanee et al., "Microelectronic Wire Bonding Apparatus Having a Galvanometric Motor", U.S. Patent Application Ser. No. 54,324, 7/2/79.

Primary Examiner—C. C. Shaw
Attorney, Agent, or Firm—Thomas W. Demond; Rich Donaldson; Mel Sharp

[57] ABSTRACT

An apparatus and method of forming aluminum balls utilized for ball bonding. The aluminum balls are formed in a moist argon atmosphere by applying an electrical potential across a spark gap causing a spark to occur which causes the end of the aluminum wire to melt, forming an aluminum ball.

11 Claims, 8 Drawing Figures

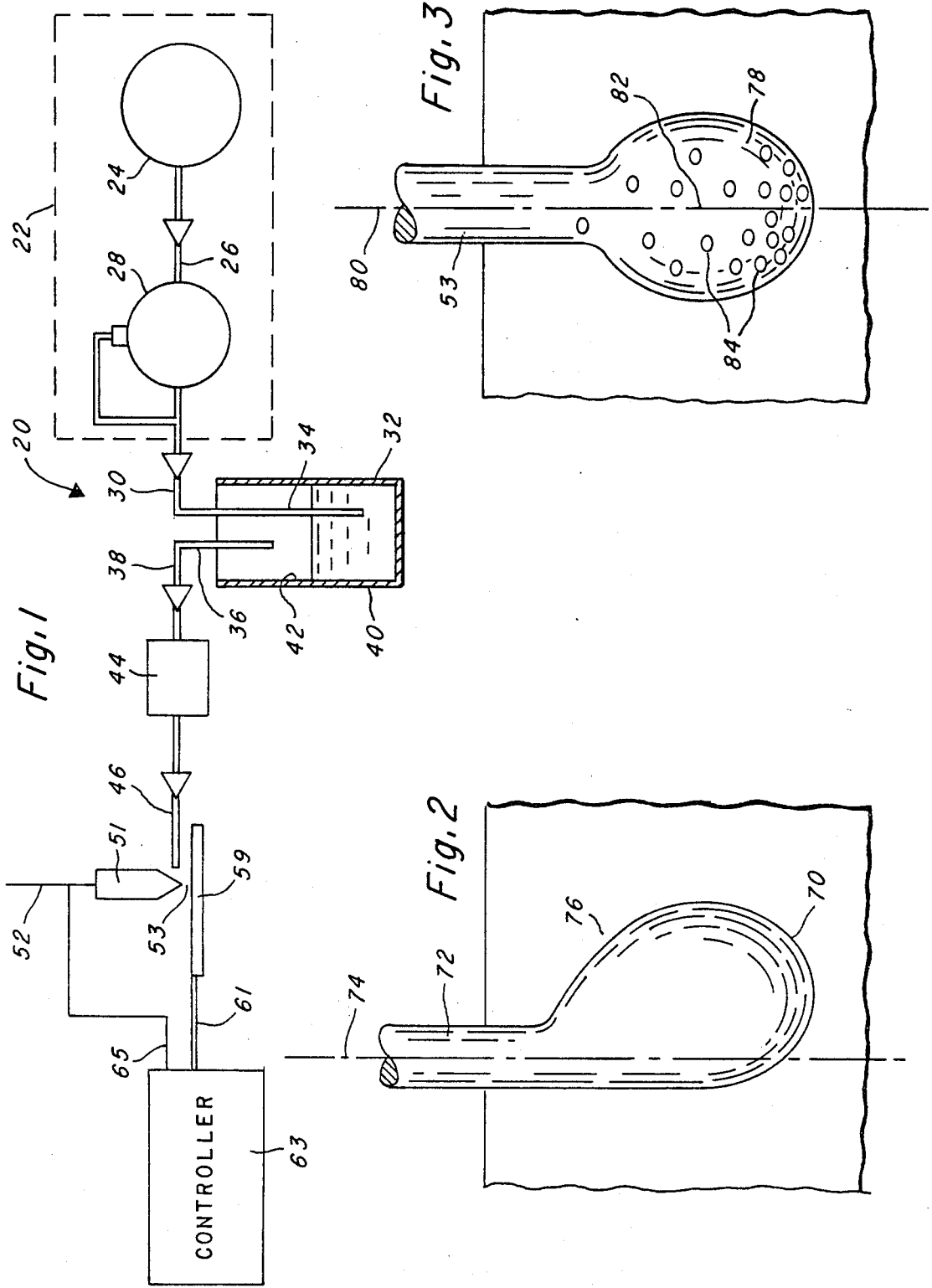

APPARATUS AND METHOD OF FORMING ALUMINUM BALLS FOR BALL BONDING

FIELD OF THE INVENTION

This invention relates to an apparatus and method of forming aluminum balls for ball bonding. More particularly, this invention relates to an apparatus and method of forming aluminum balls for ball bonding from aluminum wire which utilizes a moist argon gas supply directed toward the area of ball formation.

DESCRIPTION OF THE PRIOR ART

The basic ball bonding technique is shown in U.S. Pat. No. 3,641,660, issued to Adams et al. on Feb. 15, 1972, and entitled "The Method of Ball Bonding with an Automatic Semiconductor Bonding Machine". Adams shows and describes ball formation at the end of a wire for bonding to a first bonding pad by a compression arm. The compression arm has a capillary tube attached with the aluminum wire slideably disposed within the capillary of the capillary tube. The compression arm, is then moved to a second bonding pad as the wire is positively fed and stitched bonded to the second pad. This technique is utilized to bond the various input/output bonding pads of a semiconductor device which can be, for example, an integrated circuit to the bonding pads of, for example, a lead frame of a chip carrier.

Pressure is applied through the compression arm and the capillary tube to form the bond between the bonding pad and the ball. Additional energy is applied to the bonding area, for example, ultrasonically or thermally.

After the ball is formed, the compression arm moves the ball into contact with the bonding pad of the integrated circuit and downward force is applied to the capillary tube. Pressure and energy are applied to the bonding area through the capillary tube to form a bond between the ball formed previously on the end of the wire and the bonding pad. The compression arm then moves the capillary tube to the bonding pad of the lead frame while wire is positively feed out through the capillary tube to form a wire loop. Pressure and energy are again applied to the bonding area through the capillary tube to form a bond between the wire and the bonding pad of the lead frame. The capillary tube is then pulled away from the bonding pad by the compression arm. While the capillary tube is moved away from the bonding pad, the wire extending through the capillary tube is latched and this causes the portion of the wire extending from the bonding pad through the capillary tube to detach from the bonding pad. This leaves only the wire loop extending from the bonding pad of the integrated circuit to the bonding pad of the lead frame. Another ball is then formed at the end of the wire extending from the capillary tube.

The wire originally used for forming balls for ball bonding was gold. Since the price of gold has increased dramatically, it has been found desirable to substitute another metal for gold. Aluminum is a metal which has been found useful for ball bonding purposes. However, it was found difficult to form aluminum balls which were centered about the longitudinal axis of the aluminum wire. Originally, the gold balls on gold wire were formed utilizing a flame. However, this technique was found to be undesirable when used with aluminum wire. Another technique for forming balls from both gold and aluminum wire is to subject the end of the wire extending from the capillary tube to heat by forming a spark gap with an electrode and applying an electrical potential to initiate a spark across the spark gap. Although this improved the quality of the balls formed from aluminum, the aluminum balls were not centered along the longitudinal axis of the aluminum wire. The utilization of an inert gas directed toward the area where the ball was to be formed was found useful. However, the problem of the aluminum balls being skewed from the longitudinal axis of the wire remained although some improvement was obtained and the balls formed were properly shaped. In order to deskew the balls, force is applied to deform the ball and the wire so that the ball is approximately concentric with the longitudinal axis of the wire. One technique is to apply tension to the wire and draw the ball into contact with a chamfer located at the top of the capillary tube adjacent the capillary. The chamfer forces the center of the ball toward the longitudinal axis of the wire. In addition, a vibrating force is applied to the wire in some applications. However, these techniques induce stress into the transition area between the ball and the wire. The induced stress is undesirable as in many instances the stress weakens the transition area between the ball and the wire. Further, the stress influences the quality of the wire loops formed between bonding pads. Additional background information is available in U.S. Pat. No. 4,098,447, granted to Edson et al. on July 4, 1978 and entitled "Bonding Method and Apparatus".

None of the prior constructions and methods of forming aluminum balls for ball bonding shows or describes the utilization of moist argon gas.

SUMMARY OF THE INVENTION

The present invention involves an apparatus and method of forming aluminum balls from aluminum wire for ball bonding purposes. An argon gas supply provides argon gas at a known pressure. The argon gas is passed through a sealed humidifier for the purposes of saturating the gas with water vapor. The gas is then passed through a temperature control which maintains the temperature of the gas at approximately 100° F.

An aluminum wire extends through a rigid capillary tube which is attached to a compression arm. The compression arm is movable and is capable of applying force and energy at the capillary tip of the capillary tube. The compression arm is also capable of moving the capillary tube to a position adjacent an electrode. Specifically, the end of the aluminum wire passing through the capillary tube and extending beyond the capillary tube is brought into a position closely adjacent to the electrode. Thus, a spark gap is formed between the end of the aluminum wire extending from the capillary tip and the electrode. The moist argon gas from the heater is directed by a nozzle toward the electrode and the aluminum wire extending from the capillary tip. The spark effect, which includes the arcing of the electrons across the spark gap, causes heating of the end of the aluminum wire. The aluminum wire then melts and surface tension forces cause the formation of a ball. The ball should generally have a diameter of approximately twice the diameter of the wire from which it is formed although the ball size can be varied. When the capillary is in the proper position with the end of the aluminum wire closely adjacent to but spaced from the electrode, a controller actuates and provides an electric potential between the wire and the electrode. It has been found to be useful to have a relatively negative potential applied to the aluminum wire and a relatively positive potential applied to the electrode. It has also been found useful to heat the moist argon gas to approximately 100° F., although this can be eliminated if desired.

It is an advantage of the present invention to produce aluminum balls for ball bonding at the end of an aluminum wire which are concentric with the longitudinal axis of the aluminum wire.

It is another advantage of the present invention to produce aluminum balls on the ends of an aluminum wire for ball bonding which are less prestressed by straightening the ball to be concentric with the axis of the wire after formation of a skewed ball.

Another advantage of the present invention is to provide aluminum balls at the end of an aluminum wire for ball bonding purposes which are concentric with the longitudinal axis of the aluminum wire for proper wire loop formation between the bonding pad of the integrated circuit and the bonding pad of the lead frame.

BRIEF DESCRIPTION OF THE DRAWINGS

FIG. 1 is a schematic diagram, partly electrical, partly hydraulic, partly mechanical, of a system utilizing the present invention;

FIG. 2 is a view in perspective of an aluminum ball formed at the end of an aluminum wire;

FIG. 3 is a view in perspective of an aluminum ball formed according to the present invention;

DESCRIPTION OF THE PREFERRED EMBODIMENT

Figure 4:
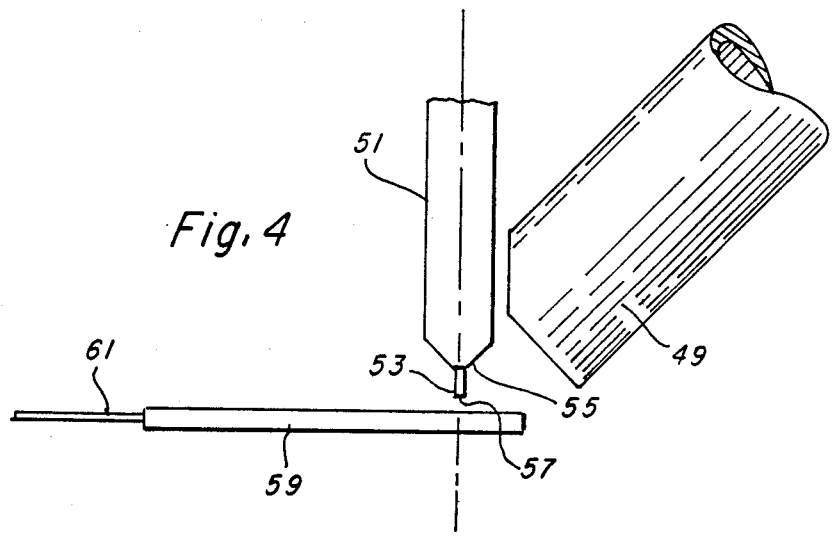
FIG. 4 is an enlarged view of the capillary tube, electrode, and nozzle of FIG. 1.

The system 20 as shown in FIG. 1 has an argon gas supply 22. The argon gas supply 22 has a tank 24 providing argon gas under pressure through conduit 26 to a gas pressure regulator 28. The output of regulator 28, which is a constant, known pressure, is connected through conduit 30 to a hermetically sealed humidifier 32. The output of gas regulator 28 is also the output or argon gas supply 22. The argon gas from regulator 28 passes into a tube 34 which extends beneath water in humidifier 32 for allowing the argon gas from conduit 30 to bubble through the water thereby saturating the argon gas with water vapor. The moist argon gas is collected by a tube 36 which is above the surface of the water within humidifier 32 and in turn enters into a conduit 38. The water within the humidifier 32 can be at ambient room temperature within the range of approximately 75° F. to 85° F. for proper saturation of the argon gas. Tube 36 is connected to one end of conduit 38. Humidifier 32 has an hermetically sealed enclosure 40 through which tubes 34 and 36 pass. The interior opening 42 within enclosure 40 contains the water for saturating the argon gas.

The moist argon gas from conduit 38 passes through a temperature control device 44 and into a conduit 46. A nozzle 49 (FIG. 4) is located at the end of conduit 46 for directing the moist argon gas as desired. Nozzle 49 can be of any convenient shape for directing the moist argon gas and can be even the open end of conduit 46. Temperature control device 44 is provided between conduits 38 and 46 for maintaining the moist argon gas at a temperature of at least 95° F. and preferably at approximately 100° F. The temperature control device is generally be a heater because the argon gas from the tank 24 is cooled as it is passed through gas regulator 28 to the lower pressures within conduits 30, humidifier 32, conduit 38, temperature control device 44, and conduit 46. In other words, the lowering of the gas pressure results in a lower temperature of the argon gas. Temperature control device 44 can be eliminated if desired.

Figure 5:
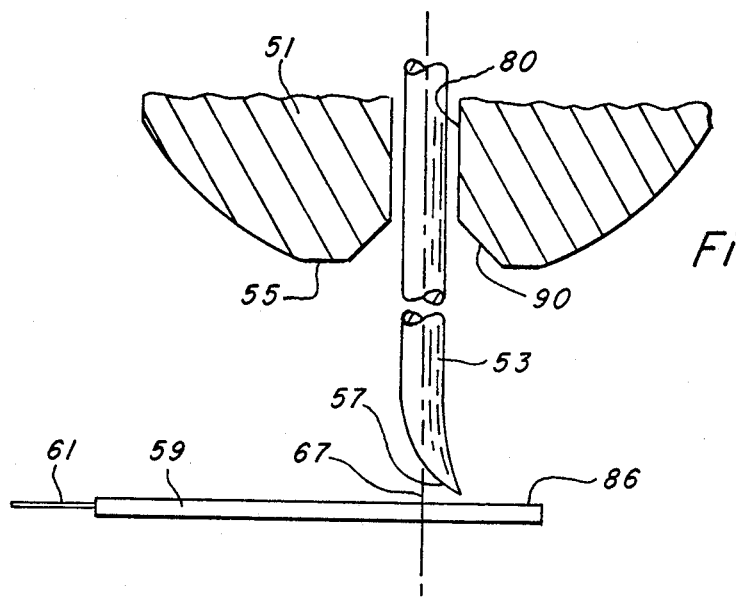
FIGS. 5, 6, and 7 show various stages of ball formation at the end of an aluminum wire in cross section.

A rigid capillary tube 51 has an aluminum wire 53 passing through a small hole (designated by numeral 88 in FIG. 5) in its interior toward a capillary tip 55 (FIG. 4). The capillary tube 51 is positioned by a compression arm (not shown) so that the end 57 (FIG. 5) of aluminum wire 53 is closely adjacent to an electrode 59. Electrode 59 is connected through line 61 to a controller 63. Controller 63 is also connected through line 65 to wire 53. Controller 63 is adapted to provide at its outputs to lines 61 and 65 an electrical potential. The electrical potential provided is sufficient to cause a spark, i.e., a flow of electrons between the end 57 (FIG. 5) of wire 53 and electrode 59 across a spark gap 67 (FIG. 5). The flow of electrons between wire 53 and electrode 59 causes a rise in the temperature of end 57 which in turn causes the aluminum close to end 57 (FIG. 5) comprising wire 53 to melt in sufficient quantities to form an aluminum ball at the end of wire 53. Controller 63, when actuated, provides the proper potential to lines 61 and 65 for causing sufficient heating of end 57 of wire 53 to cause the formation of an aluminum ball of the desired size.

A general explanation of the various components comprising a ball bonding system is described in U.S. Pat. No. 4,098,447 by Edson et al., issued on July 4, 1978 and entitled "Bonding Method and Apparatus", U.S. Pat. No. 3,641,660 by Adams et al., issued on Feb. 15, 1972, and entitled "The Method of Ball Bonding with an Automatic Semiconductor Bonding Machine", U.S. patent application Ser. No. 250,623, by Landes, filed on Mar. 30, 1981 and entitled "Self Starting Current Control Discharge Bonding Wire Ball Maker", and U.S. patent application Ser. No. 54,324, by Van Luvanee et al., Filed on July 2, 1979, and entitled "Microelectronic Wire Bonding Apparatus Having a Galvanometric Motor", which are incorporated by reference hereinto.

The electrode 59 is positioned below the capillary tube 51 and the wire 53 extends generally downward toward the electrode. Thus, the electrode is positioned close to and below the wire 53 with the longitudinal axis of wire 53 being essentially parallel to the electron flow across the spark gap 67.

An aluminum ball 70 is shown in FIG. 2 formed on the end of aluminum wire 72. Ball 70 was formed utilizing dry argon gas. The longitudinal axis 74 of wire 72 is not concentric with the approximate center 76 of ball 70. In other words, ball 70 is skewed from the longitudinal axis 74 of wire 72.

Aluminum ball 78 (FIG. 3) on the end of aluminum wire 53 is concentric with the longitudinal axis 80 of wire 53. Longitudinal axis 80 passes through the approximate center 82 of ball 78. 82 is the approximate center because ball 78, due to gravitation, thermal, and other dynamic effects, is not a perfect sphere. Ball 78 was formed in the moist heated argon atmosphere provided by system 20 of FIG. 1. The surface of ball 78 has a plurality of pits 84. If the argon gas does not have a temperature of at least 95° F., the pits become more prevalent and internal porosity of the ball formed utilizing the moist argon gas increases. The pits 84 occur generally on the lower ⅔ portion of the ball 78 and have been found not to affect the strength of the bonds formed with the bonding pad and the strength of the transition area.

As shown in FIG. 4, nozzle 49 directs the moist argon gas toward the end 55 of capillary 51, the end 57 of wire 53, and electrode 59. Thus, the spark gap 67 (FIG. 5) has a flow of moist argon gas directed thereinto. Some mixing of the ambient air with the argon gas is expected and has been found not to have any great affect on aluminum ball formation performed according to the present invention.

Figure 6:
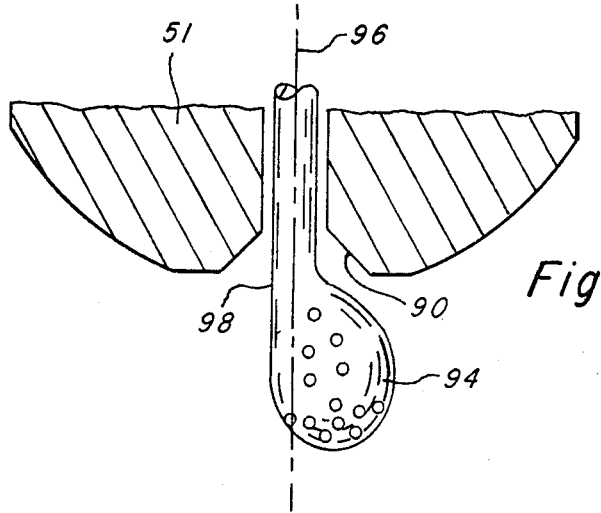
Figure 7:
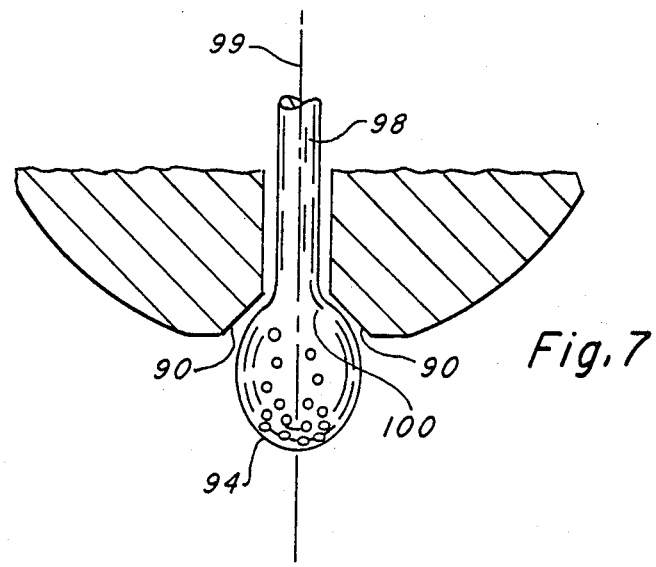

In FIG. 5, the capillary tip 55 of capillary tube 51 and wire 53 are shown in cross section, which is also true of FIGS. 6 and 7. Electrode 59 is shown in more detail as positioned below and closely adjacent to end 57 of wire 53. This leaves a small spark gap 67 between end 57 in the upper flat surface 86 of electrode 59. The cylindrical opening 88 in capillary tube 51 has wire 53 slidably disposed therein. Cylindrical opening 88 is connected to capillary tip 55 by a chamfer or conically shaped bevel 90.

An aluminum ball 94, which is skewed with respect to the longitudinal axis 96 of aluminum wire 98 to which it is attached, is shown in FIG. 6. One method utilized to straighten a skewed ball such as ball 94 is to apply a vibrating force to wire 98 while drawing ball 94 into contact with the bevel 90. Bevel 90 forces ball 94 as shown in FIG. 7 into general alignment with longitudinal axis 96 of wire 98. However, strain is induced into transition area 100 between the ball 94 and wire 98. This strain can cause cracks to be formed and other stress problems.

Figure 8:
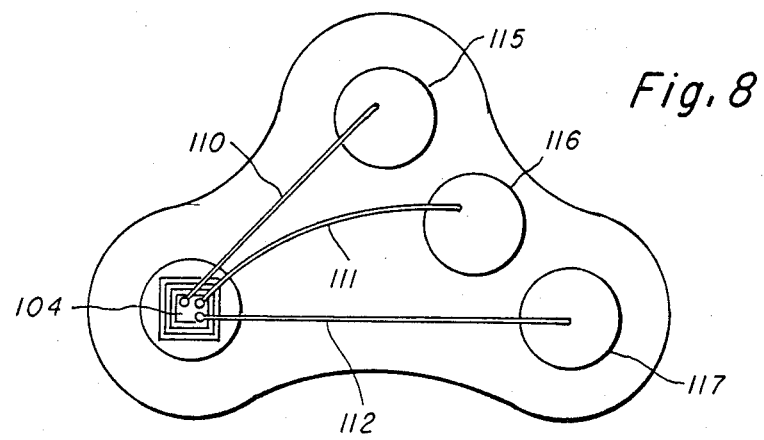
FIG. 8 shows a problem which results from applying stress to wire balls before bonding.

A problem which results from applying stress to the balls before bonding is shown in FIG. 8. An integrated circuit 104 has wire loops 110 through 112 connected thereto. The bond is first made with the contact pad on integrated circuit 104 utilizing the formed aluminum ball. The wire loops are then formed and the second bond is made to a contact pad. Loops 110 through 112 are connected to contact pads 115 through 117, respectively. The contact pads on the integrated circuit 104 are too small to be readily visible within FIG. 8. The aluminum ball utilized to form the bond of wire loop 111 with integrated circuit 104 was prestressed which can cause loop 111 with integrated circuit 104 was prestressed which can cause loop 111 to have a bowed shape extending toward wire loop 110. If loop 110 had a bowed shape which resulted from the prestressing of the aluminum ball utilized to bond it to integrated circuit 104 in the direction toward loop 111, the loops 110 and 111 could touch, thereby causing a short. This would cause the packaged integrated circuit to be defective.

In operation, the gas supply 22 provides argon gas at a known pressure producing a flow rate of approximately 1 liter/min. to humidifier 32. Humidifier 32 saturates the dry argon gas with water vapor and provides the moist argon gas through a conduit 38 to a temperature control device 44. The temperature control device 44 maintains the moist argon gas at a temperature of approximately 100° F. The moist temperature controlled argon gas is provided at a nozzle 49 and directed toward the end of capillary 51, the end 57 of wire 53 and a portion of electrode 59. Specifically, the argon gas is directed toward the portion of wire 53 extending from cylindrical opening 88 and into spark gap 67. Spark gap 67 should be 2 to 6 mils. Controller 63 applies an electrical potential with the negative most potential applied through line 65 to wire 53 and the relatively positively potential to electrode 59. This causes an arcing across the spark gap 67 which in turn causes the end 57 of wire 53 to melt, forming an aluminum ball such as the aluminum ball 78 of FIG. 3. The end 57 is melted by the heat caused by the spark across spark gap 67 which melts the lower portion of wire 53 (as shown in FIG. 5) and causes the formation of the aluminum ball by surface tension forces. The aluminum balls formed with moist argon are generally centered along the longitudinal axis of the aluminum wire and the skewed balls occasionally produced are generally less skewed than the aluminum balls formed using only dry argon gas.

If desired to conserve the argon gas, controller 63 can be adapted to provide an output signal to a solenoid valve (not shown) inserted into conduit 46 to provide gas to nozzle 49 only just prior to applying potential across spark gap 67 and during the formation of ball 78. After ball 78 solidifies from its melted state, controller 63 deactuates the solenoid valve to stop the flow of moist argon gas through nozzle 49. An enclosure can be provided to encircle the electrode 59, the nozzle 49, and the end of the aluminum wire 57, if desired.

Whereas the present invention has been described in particular relation to the drawings attached hereto, it should be understood that other and further modifications, apart from those shown or suggested herein, may be made within the spirit and scope of this invention.

What is claimed is:

1. An apparatus for forming an aluminum ball on an end of an aluminum wire comprising:
   (a) an electrode located closely adjacent said end of said aluminum wire and spaced therefrom for providing a spark gap when electrical potential is applied between said aluminum wire and said electrode to heat said end of said aluminum wire to form said aluminum ball;
   (b) a supply of argon gas;
   (c) a humidifier connected to said supply to produce a flow of moist argon gas; and
   (d) a nozzle connected to said humidifier for providing moist argon gas at said end of said aluminum wire.

2. Apparatus as set forth in claim 1 including a heater for heating said moist argon gas to approximately 100° F.

3. Apparatus as set forth in claim 1 wherein said supply provides argon gas while electrical potential is applied between said aluminum wire and said electrode.

4. Apparatus as set forth in claim 1, including a partial enclosure disposed about said nozzle, said electrode, and said end of said aluminum wire.

5. An apparatus for forming an aluminum ball at an end of an aluminum wire comprising:
   (a) an electrode located closely adjacent said end of said aluminum wire and spaced therefrom for providing a spark gap when an electrical potential is present between said aluminum wire and said electrode for heating said aluminum wire to form said aluminum ball at said end thereof;
   (b) a supply of argon gas under pressure;
   (c) a humidifier connected to said supply for producing a flow of moist argon gas;
   (d) a nozzle connected to said humidifier for directing said flow of moist argon gas generally toward said end of said wire and said electrode; and (e) a temperature control device in thermal communication with said moist argon gas intermediate said humidifier and said nozzle for maintaining the flow of moist argon gas at a temperature above 95° F.

6. An apparatus for forming an aluminum ball on an end of an aluminum wire comprising:
   (a) a controller selectively providing an electrical potential at a negative and positive output thereof with said negative output connected to said aluminum wire;
   (b) an electrode connected to said positive output and located closely adjacent to said end of said aluminum wire to form a spark gap therewith for said electrical potential to heat said end forming said aluminum ball;
   (c) a flow of moist argon gas directed toward said end of said aluminum wire; and
   (d) a temperature control device in thermal communication with said flow of moist argon gas for maintaining temperature thereof at approximately 100° F.

7. Apparatus for thermally forming an aluminum ball at an end of an aluminum wire comprising:
   (a) first means connected closely adjacent to and spaced from said end of said aluminum wire for forming a spark gap therewith;
   (b) a second means connected to said first means and said aluminum wire for selectively producing an electrical spark across said spark gap; and
   (c) third means located adjacent said first means and said end of said aluminum wire for providing moist argon gas with a temperature of at least 95° F. within said spark gap and at said end of said aluminum wire at least prior to and during the electric spark.

8. Apparatus as set forth in claim 7 wherein said second means connects said first means and said aluminum wire to relatively positive and negative electrical potentials, respectively.

9. Apparatus for forming an aluminum ball on an end of an aluminum wire by heating said end to melt said wire comprising:
   (a) first means located closely adjacent to and spaced from said end of said aluminum wire for forming a spark gap therewith;
   (b) a second means connected to said first means and said aluminum wire for selectively producing an electric spark across said gap; and
   (c) third means located adjacent said first means and said aluminum wire for directing a flow of moist argon gas toward said end of said aluminum wire and said first means.

10. A method for thermally forming aluminum balls on an end of an aluminum wire comprising the steps of:
    (a) providing moist argon gas at said end of said aluminum wire; and
    (b) applying an electric spark to said end of said aluminum wire to heat said end for forming said ball.

11. A method for forming an aluminum ball from an end of an aluminum wire comprising the steps of:
    (a) providing moist argon gas having a temperature of at least 95° F. at said end of said aluminum wire; and
    (b) heating said end of said aluminum wire to melt said wire for forming said aluminum ball by applying an electric spark to said end of said aluminum wire with said aluminum wire having a relative negative potential across said spark gap.

* * * * *